United States Patent
Kondo et al.

(10) Patent No.: US 9,814,161 B2
(45) Date of Patent: Nov. 7, 2017

(54) ELECTRONIC DEVICE RACK AND INFORMATION PROCESSING APPARATUS

(71) Applicant: FUJITSU LIMITED, Kawasaki-shi, Kanagawa (JP)

(72) Inventors: Masao Kondo, Sagamihara (JP); Hiroyuki Fukuda, Ebina (JP); Shigeyoshi Umemiya, Fujisawa (JP); Hiroshi Endo, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 268 days.

(21) Appl. No.: 14/290,910

(22) Filed: May 29, 2014

(65) Prior Publication Data

US 2014/0268547 A1    Sep. 18, 2014

Related U.S. Application Data

(63) Continuation of application No. PCT/JP2011/077791, filed on Dec. 1, 2011.

(51) Int. Cl.
*H05K 7/00* (2006.01)
*H05K 7/20* (2006.01)
*G06F 1/20* (2006.01)

(52) U.S. Cl.
CPC ......... *H05K 7/20736* (2013.01); *G06F 1/206* (2013.01); *H05K 7/20818* (2013.01);
(Continued)

(58) Field of Classification Search
USPC ................................................ 361/688–703
See application file for complete search history.

(56) References Cited

U.S. PATENT DOCUMENTS 7,051,802 B2 *  5/2006  Baer ................. H05K 7/20736
                                                165/299
8,789,384 B2 *  7/2014  Eckberg ............... F28D 1/0435
                                                165/104.33
(Continued)

FOREIGN PATENT DOCUMENTS

CN         102791110        11/2012
DE      202009013664 U1      1/2010
(Continued)

OTHER PUBLICATIONS

EESR—The Extended European Search Report of European Patent Application No. 11876495.0 dated Dec. 9, 2015.
(Continued)

*Primary Examiner* — Dimary Lopez Cruz
*Assistant Examiner* — Zhengfu Feng
(74) *Attorney, Agent, or Firm* — Fujitsu Patent Center

(57) ABSTRACT

An electronic device rack includes a plurality of panels surrounding a first space. Moreover, the electronic device rack includes: an electronic-device housing unit disposed in the first space and configured to house electronic devices; a heat exchanger disposed in the first space at a position away from the electronic-device housing unit; a second space provided between the electronic-device housing unit and the heat exchanger and isolated from the rest of the first space; and an air blower configured to circulate air inside the first space through the electronic-device housing unit, the second space, and the heat exchanger in the described order.

4 Claims, 8 Drawing Sheets

(52) U.S. Cl.
CPC ... *H05K 7/20836* (2013.01); *G06F 2200/201* (2013.01); *Y02B 60/1275* (2013.01)

(56) References Cited

U.S. PATENT DOCUMENTS

| | | | | |
|---|---|---|---|---|
| 2004/0099747 A1* | 5/2004 | Johnson | ............ | H05K 7/20836 236/49.3 |
| 2008/0068791 A1* | 3/2008 | Ebermann | ................. | G06F 1/20 361/679.49 |
| 2008/0232064 A1* | 9/2008 | Sato | ................... | H05K 7/20754 361/679.49 |
| 2009/0046429 A1* | 2/2009 | Werner | .............. | H05K 7/20736 361/701 |
| 2009/0100848 A1* | 4/2009 | Kuriyama | .......... | H05K 7/20745 62/132 |
| 2009/0154096 A1* | 6/2009 | Iyengar | .............. | H05K 7/20754 361/694 |
| 2009/0168345 A1* | 7/2009 | Martini | ................ | F24F 11/0001 361/691 |
| 2009/0210096 A1* | 8/2009 | Stack | ................... | F24F 11/0009 700/278 |
| 2010/0154448 A1* | 6/2010 | Hay | ........................... | G06F 1/20 62/175 |
| 2011/0105010 A1* | 5/2011 | Day | ................... | H05K 7/20745 454/184 |
| 2011/0314853 A1* | 12/2011 | Ito | ..................... | H05K 7/20836 62/186 |
| 2012/0006507 A1* | 1/2012 | Su | ...................... | H05K 7/20754 165/80.2 |
| 2012/0291465 A1* | 11/2012 | Kashirajima | ...... | H05K 7/20836 62/126 |

FOREIGN PATENT DOCUMENTS

| | | |
|---|---|---|
| EP | 2190276 A2 | 5/2010 |
| EP | 2525639 A2 | 11/2012 |
| JP | 2-278896 | 11/1990 |
| JP | 2007-335497 | 12/2007 |
| JP | 2008-84916 | 4/2008 |
| JP | 2008-518432 | 5/2008 |
| JP | 2009-216295 | 9/2009 |
| JP | 2009-277875 | 11/2009 |
| JP | 2010-54074 | 3/2010 |
| JP | 2011-226737 | 11/2011 |

OTHER PUBLICATIONS

CNOA—Chinese Office Action dated Feb. 23, 2016 for corresponding Chinese Patent Application No. 201180075184.2, with Full translation of the Office Action.
CNOA—Office Action of Chinese Patent Application No. 201180075184.2 dated Jul. 31, 2015, with full English translation.
JPOA—Office Action of Japanese Patent Application No. 2013-546919 dated Jan. 6, 2015, with English translation of relevant part, p. 1, line 25 to p. 3, line 21, of the Office Action.
International Search Report, mailed in connection with PCT/JP2011/077791 dated Jan. 17, 2012.

* cited by examiner

ELECTRONIC DEVICE RACK AND INFORMATION PROCESSING APPARATUS

CROSS-REFERENCE TO RELATED APPLICATION

This application is a continuation of International Patent Application No. PCT/JP2011/077791 filed Dec. 1, 2011 and designated the U.S., the entire contents of which are incorporated herein by reference.

FIELD

The embodiments discussed herein are related to an electronic device rack and an information processing apparatus.

BACKGROUND

Along with the progress in cloud services provided by utilizing communication networks, the power consumption of datacenters serving as infrastructures for providing cloud systems has been increasing.

In a datacenter, many racks (server racks) are placed in a computer room, and a plurality of computers (servers) are housed in each rack. Moreover, jobs are organically distributed to the computers according to the states of operation of the computers to thereby process a large amount of jobs efficiently.

Computers generate a large amount of heat as the computers operate. Since high temperature inside a computer may be a cause of malfunction or failure, it is important to cool the computer. For this reason, a datacenter usually uses air blow fans to discharge heat generated by computers to the outside of their racks, and also uses a packaged air conditioner to adjust the temperature of the room.

Meanwhile, it has been said that the power consumption for air conditioning equipment accounts for approximately 40% of the whole electric power consumption of a datacenter. In order to reduce the power consumption of a datacenter without impairing the processing performance of the datacenter, it is important to efficiently cool the computers therein.

Packaged air conditioners may be capable of accurately controlling the temperature of air blown therefrom. However, with a packaged air conditioner, it is difficult to manage the temperature distribution in a room, so that locally excessively cooled areas and locally high temperature areas called hot spots may be formed. Moreover, since packaged air conditioners are distant from racks, the packaged air conditioners are preferred to have high air blowing performance, which has been a cause of increase in their power consumption.

In view of this, in addition to a packaged air conditioner, a system called In-Row is sometimes employed which involves disposing a cooling device between racks, the cooling device having substantially the same size as the racks. In this system, hot air discharged from the racks is cooled near the racks so as to reduce the occurrence of excessive cooling and the formation of hot spots and make the air conditioning equipment less power consuming.

Patent Document 1: Japanese Laid-open Patent Publication No. 2011-226737
Patent Document 2: Japanese Laid-open Patent Publication No. 2010-54074

SUMMARY

According to one aspect of a technique disclosed herein, there is provided an electronic device rack, including: a plurality of panels surrounding a first space; an electronic-device housing unit disposed in the first space and configured to house an electronic device; a heat exchanger disposed in the first space at a position away from the electronic-device housing unit; a second space provided between the electronic-device housing unit and the heat exchanger and isolated from the rest of the first space; and an air blower configured to circulate air inside the first space through the electronic-device housing unit, the second space, and the heat exchanger in the described order.

According another aspect of the disclosed technique, there is provided an information processing apparatus, including: a plurality of panels surrounding a first space; an electronic-device housing unit disposed in the first space and in which an electronic device is housed; a heat exchanger disposed in the first space at a position away from the electronic-device housing unit; a second space provided between the electronic-device housing unit and the heat exchanger and isolated from the rest of the first space; and an air blower configured to circulate air inside the first space through the electronic-device housing unit, the second space, and the heat exchanger in the described order.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinbelow, before describing embodiments, a prelude for facilitating understanding of the embodiments will be described.

As mentioned earlier, with a packaged air conditioner, it is difficult to efficiently cool computers since excessive cooling may occur and hot spots may be formed. In view of this, a system called In-Row is sometimes employed.

However, while the amount of heat generated per rack is currently around 10 kW, the amount of heat generated per rack is expected to be 30 kW or larger in the near future. Thus, with the publically known method mentioned earlier, it will be difficult to cool electronic devices housed in racks.

In the following embodiments, description will be given of electronic device rack and information processing apparatus which may be capable of efficiently cooling electronic devices even when the amount of heat generated per rack reaches 30 kW or larger.

First Embodiment

Figure 1:
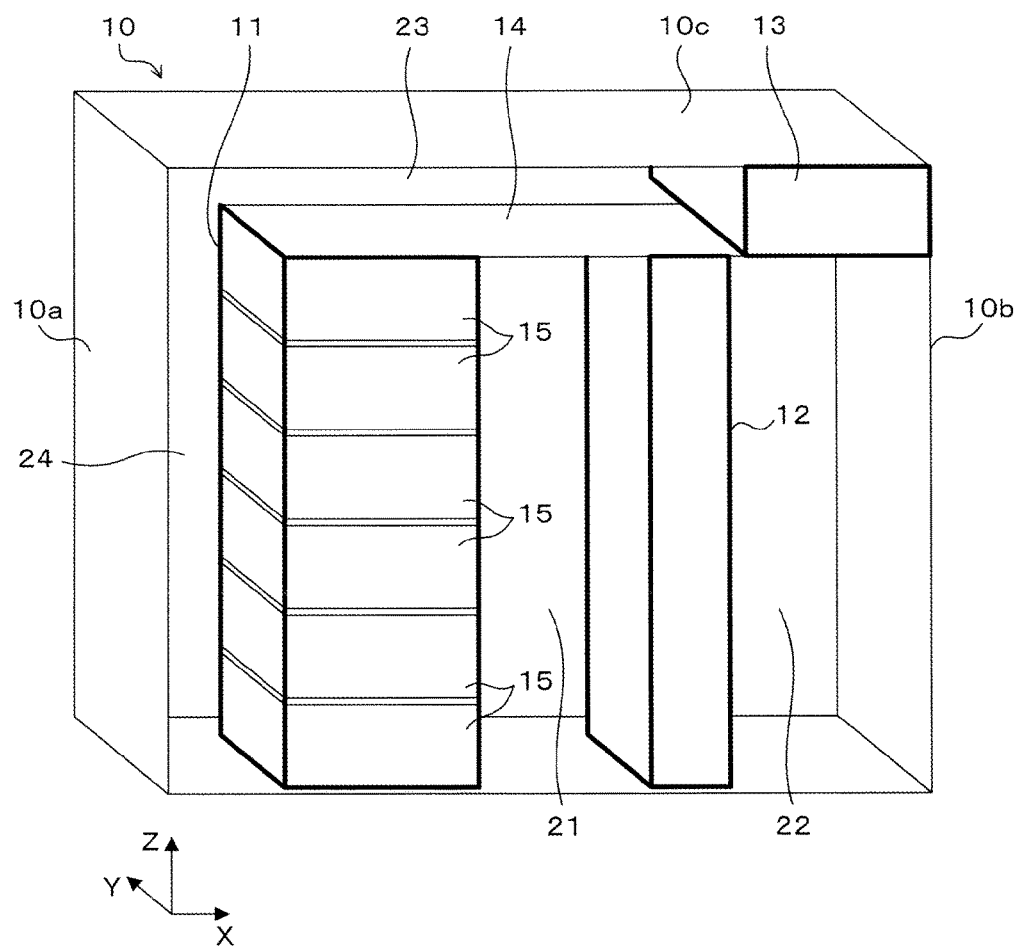
FIG. 1 is a schematic view illustrating an electronic device rack and an information processing apparatus being the electronic device rack and electronic devices housed therein according to a first embodiment.

FIG. 1 is a schematic view illustrating an electronic device rack and an information processing apparatus being the electronic device rack and electronic devices housed therein according to a first embodiment. Note that in this section, an X direction, a Y direction, and a Z direction in FIG. 1 are assumed to be a front-rear direction, a width direction, and a height direction, respectively, for the sake of explanation.

As illustrated in FIG. 1, an electronic device rack 10 according to this embodiment has a cuboidal shape surrounded by panels 10a, 10b, 10c, . . . at its six sides. Here, at least one or both of the side panels of the rack 10 are openable and closeable so that mount, demount, and maintenance of electronic devices 15 may be done easily. Note that the space surrounded by the panels 10a, 10b, 10c, . . . corresponds to a first space.

Inside the rack 10, there are provided an electronic-device housing unit 11 configured to house the electronic devices 15, a dry-coil heat exchanger 12, and an air blow fan 13 configured to circulate air within the rack 10. Moreover, a partition board 14 is disposed above the electronic-device housing unit 11 and the heat exchanger 12.

As illustrated in FIG. 1, the electronic-device housing unit 11 and the heat exchanger 12 are disposed side by side longitudinally between the front panel 10a and the back panel 10b of the rack 10. In this embodiment, the space between the electronic-device housing unit 11 and the heat exchanger 12 will be referred to as a hot aisle 21, and the space between the heat exchanger 12 and the back panel 10b of the rack 10 will be referred to as a first cold aisle 22. Moreover, the space between the front panel 10a of the rack 10 and the electronic-device housing unit 11 will be referred to as a second cold aisle 24, and the space between the upper panel 10c of the rack 10 and the partition board 14 will be referred to as a cool-air flow path 23. The hot aisle 21 corresponds to a second space.

The hot aisle 21 is isolated from the other spaces by the electronic-device housing unit 11, the heat exchanger 12, the partition board 14, and the side panels of the rack 10. Moreover, the cool-air flow path 23 and the second cold aisle 24 communicate with each other such that air may freely flow therethrough.

The electronic-device housing unit 11 houses a plurality of electronic devices 15 arranged in the height direction. In this embodiment, each electronic device 15 is assumed to be a server (computer). However, instead of a server or along with a server, an electronic device such as a storage or a switch may be housed in the electronic-device housing unit 11.

One side (left side in FIG. 1) of each electronic device 15 is an air inlet side while the other side (right side in FIG. 1) is an air outlet side. Each electronic device 15 is disposed with the air inlet side facing the second cold aisle 24 and with the air outlet side facing the hot aisle 21.

Figure 2:
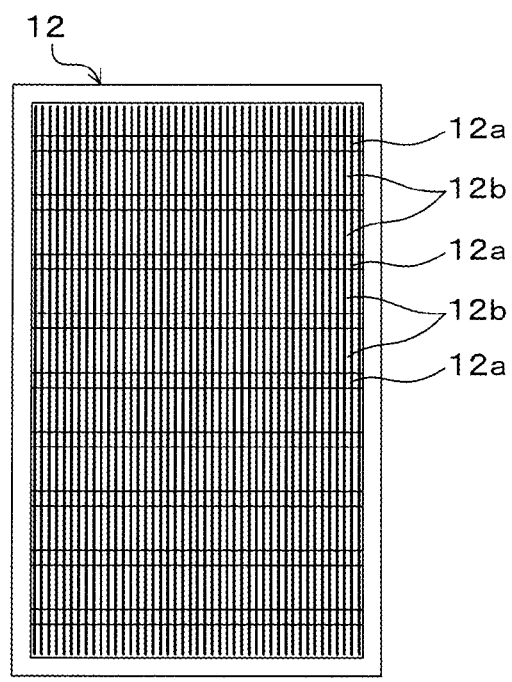
FIG. 2 is a front view of a heat exchanger.

The heat exchanger 12 includes a pipe 12a through which a cooling medium flows, and many fins 12b which are connected to the pipe 12a as illustrated in a front view of FIG. 2, and is disposed facing the air outlet sides of the electronic devices 15 housed in the electronic-device housing unit 11. Air whose temperature has risen as a result of flowing through the electronic devices 15 is cooled when flowing between the fins 12b of the heat exchanger 12. The width and height of the heat exchanger 12 are substantially equal to the width and height of the electronic-device housing unit 11.

The heat exchanger 12 is connected through pipes (not illustrated) to a cooling device (not illustrated) disposed in the open air, and the cooling medium circulates between the cooling device and the heat exchanger 12. In this embodiment, water is used as the cooling medium, and a free cooling device is used as the cooling device. The free cooling device is a device configured to cool water not by using a refrigerator but by using a phenomenon in which water, when vaporizing, takes latent heat from its surroundings.

The air blow fan 13 is disposed between the first cold aisle 22 and the cool-air flow path 23. This air blow fan 13 forms airflow which circulates through the air blow fan 13, the cool-air flow path 23, the second cold aisle 24, the electronic-device housing unit 11 (electronic devices 15), the hot aisle (second space) 21, the heat exchanger 12, and the first cold aisle 22 in the described order. The air blow fan 13 is an example of an air blower.

Note that in this embodiment, each individual electronic device 15 is not provided with an internal air blow fan, and the air blow fan 13 circulates air inside the rack 10 to make the air flow through the electronic device 15. However, the electronic device 15 may be provided with an internal air blow fan if desired.

Now, description will be given of a result obtained by actually preparing the information processing apparatus according to this embodiment and measuring the temperatures of given spots.

Figure 3:
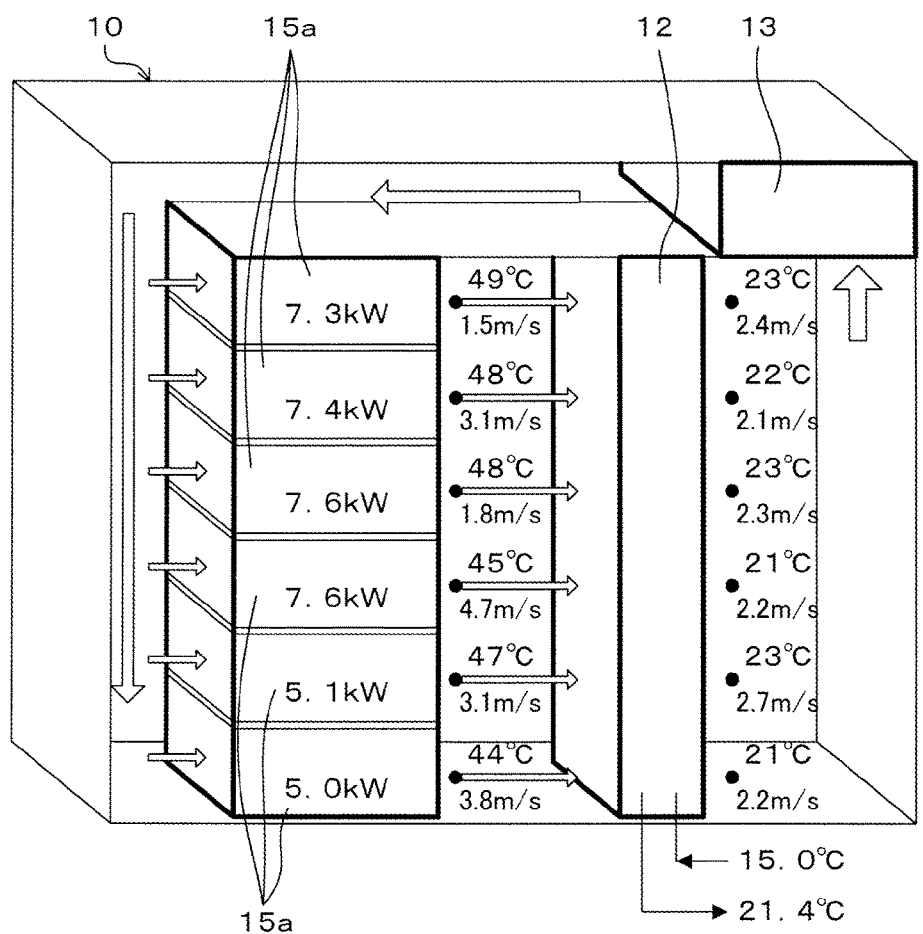
FIG. 3 is a view illustrating a result obtained by actually preparing the information processing apparatus according to the first embodiment and measuring the temperatures of given spots.

As illustrated in FIG. 3, six dummy servers 15a are housed in the electronic-device housing unit 11, and the amounts of heat generated by the dummy servers 15a are set to 7.3 kW, 7.4 kW, 7.6 kW, 7.6 kW, 5.1 kW, 5.0 kW (40 kW in total) in this order from the top, respectively. Moreover, cooling water at a temperature of 15.0° C. is supplied to the heat exchanger 12. Then, the temperatures and the flow rates of air at positions indicated by the black dots in FIG. 3 are measured.

As a result, the temperatures of the air discharged from the dummy servers 15a are 44° C. to 49° C., and the temperatures of the air after passing through the heat exchanger 12 are 21° C. to 23° C. Moreover, the temperature of the cooling water discharged from the heat exchanger 12 is 21.4° C. Note that arrows in FIG. 3 indicate the direction of flow of the air.

Figure 4:
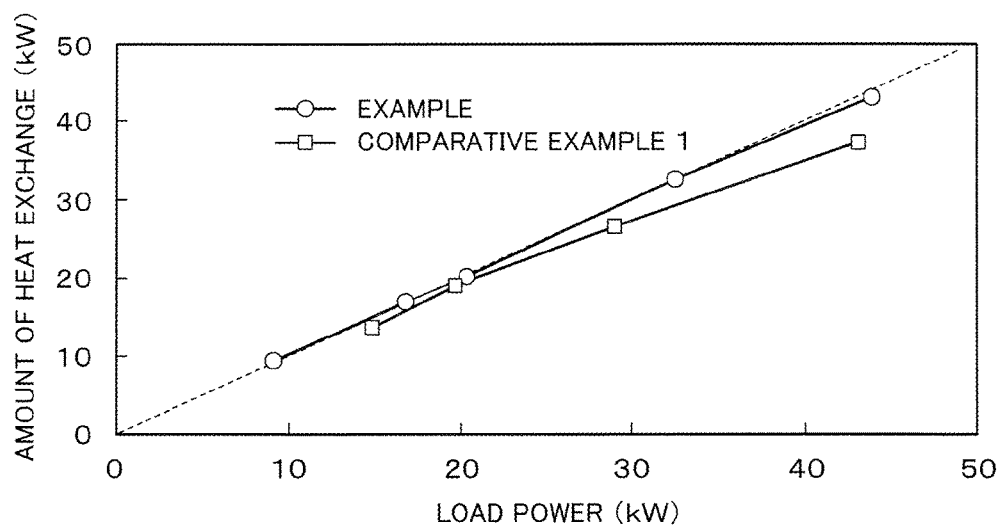
FIG. 4 is a graph illustrating a result obtained by studying the relation between load power and the amount of heat exchange in Example and Comparative Example 1.

FIG. 4 is a graph with the horizontal axis representing the total load power of the electronic devices (dummy servers) housed in the rack versus the vertical axis representing the amount of heat exchange by the heat exchanger, illustrating a result obtained by studying the relation between the load power and the amount of heat exchange in Example and Comparative Example 1. The dashed line in FIG. 4 represents a case where the load power and the amount of heat exchange are equal, specifically, a case where the heat exchanger effectiveness is 100%.

Figure 5:
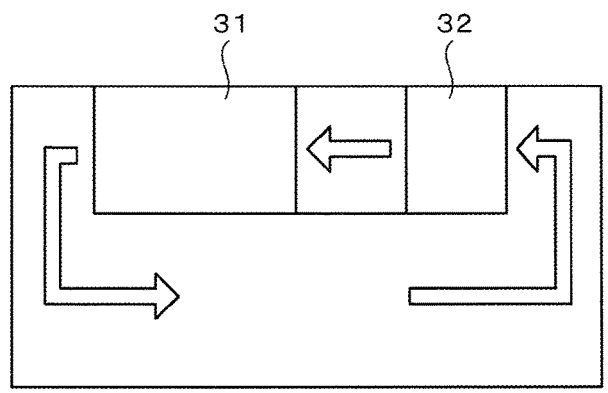
FIG. 5 is a plan view illustrating layout in Comparative Example 1.

As Example, a model in which the electronic devices 15 and the heat exchanger 12 are disposed in the rack 10 illustrated in FIG. 1 is employed. The footprint in Example is 1.1 m². Moreover, as Comparative Example 1, a model in which a rack 31 and a heat exchanger 32 are disposed in a room with a footprint of 5.2 m² as illustrated in a plan view of FIG. 5 is employed. In Comparative Example 1, air discharged from the rack 31 passes a lateral side and the upper side of the rack 31 and returns to the air inlet side of the heat exchanger 32.

As may be seen from FIG. 4, in Comparative Example 1, the heat exchanger effectiveness is substantially 100% when the load power is 20 kW or smaller, but the heat exchanger effectiveness greatly decreases from 100% once the load power exceeds 20 kW. This means that if the heat exchanger 32 fails to sufficiently manage the heat discharged from the rack 31, the temperature of the room will rise. The heat having failed to be managed by the heat exchanger 32 prefers to be managed by a packaged air conditioner or the like and released to the outside of the room.

On the other hand, in Example, the heat exchanger effectiveness is substantially 100% even after the load power exceeds 40 kW, and therefore an additional cooling device such as a packaged air conditioner is not used. However, since people come in and out of computer rooms, thereby changing the temperature thereof, it is preferable also in this embodiment to set a packaged air conditioner for adjusting the temperature of the whole room in which the rack 10 is set.

Figure 6:
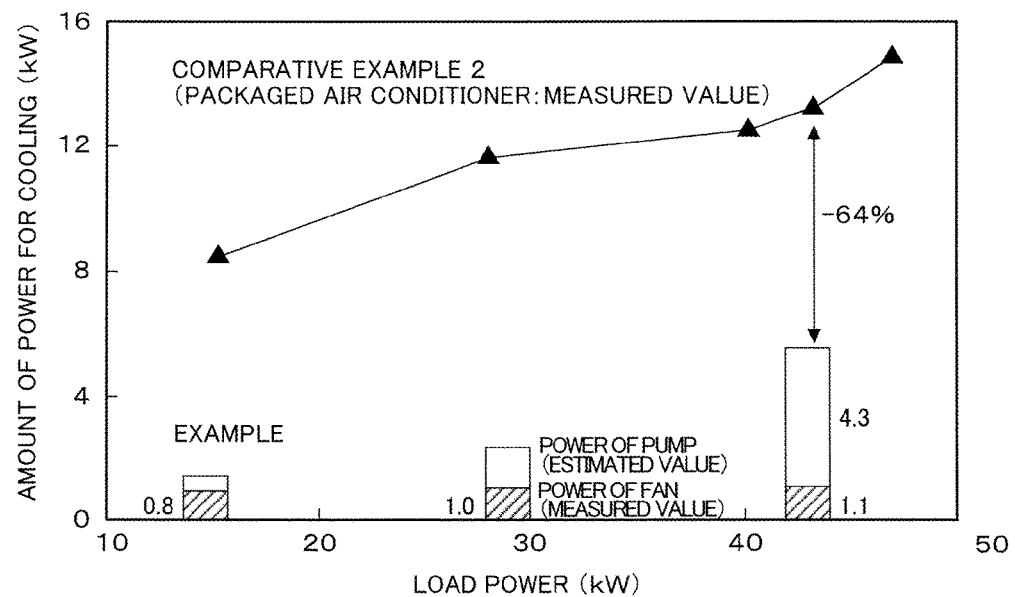
FIG. 6 is a graph illustrating the effect of Example in comparison with Comparative Example 2.

FIG. 6 is a graph with the horizontal axis representing the load power versus the vertical axis representing the amount of power for cooling, illustrating the effect of Example in comparison with Comparative Example 2.

However, as Example, a model in which electronic devices (dummy servers) and the heat exchanger 12 are disposed in the rack 10 illustrated in FIG. 1 is employed. Moreover, as Comparative Example 2, a model in which a rack housing the electronic devices and a packaged air conditioner are disposed in a room is employed. In Comparative Example 2, heat generated in the electronic devices is discharged from the rack into the room, and the air discharged to the room is cooled with the packaged air conditioner and moved to the vicinity of the rack.

Note that in FIG. 6, the power consumption in Example represents the sum of the power consumption of the air blow fan 13 and the power consumption of a pump which supplies cooling water to the heat exchanger 12. Here, the power consumption of the air blow fan 13 is a measured value while the power consumption of the pump is an estimated value. Moreover, the power consumption in Comparative Example 2 is a measured value.

As may be seen from FIG. 6, in Example, the amount of power for cooling of the electronic devices is smaller than Comparative Example 2, and the power consumption may be reduced by approximately 64% when the amount of heat generated per rack is 40 kW.

Figure 7:
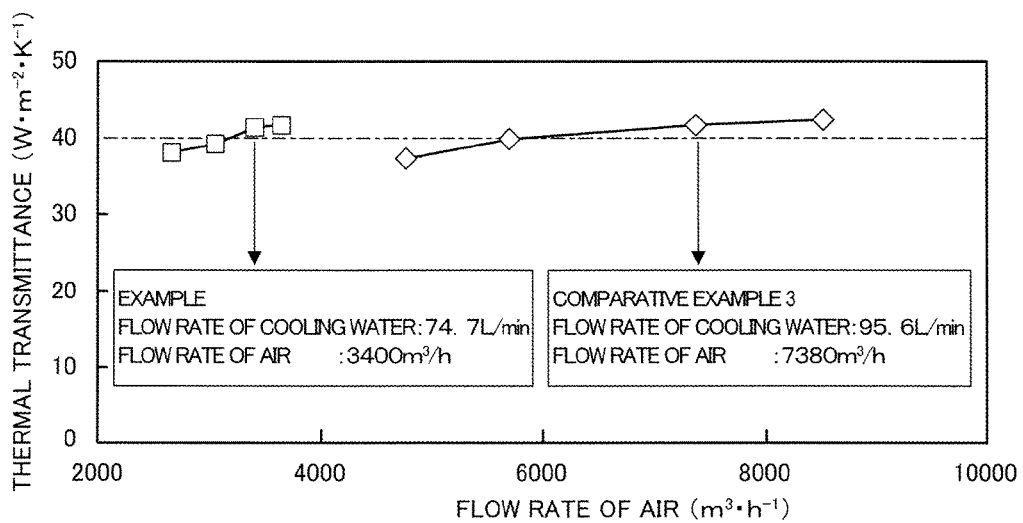
FIG. 7 is a graph illustrating a result obtained by studying the relation between the flow rate of air and the thermal transmittance in Example and Comparative Example 3.

FIG. 7 is a graph with the horizontal axis representing the flow rate of air passing through the heat exchanger versus the vertical axis representing the thermal transmittance of the heat exchanger, illustrating a result obtained by studying the relation between the flow rate of air and the thermal transmittance in Example and Comparative Example 3.

However, as Example, the model in which electronic devices (dummy servers) and the heat exchanger 12 are disposed in the rack 10 illustrated in FIG. 1 is employed. Moreover, as Comparative Example 3, a publically known In-Row cooling system is employed. Here, in both Example and Comparative Example 3, the load power is set to 30 kW, and cooling water at a temperature of 15° C. is supplied to the heat exchanger.

As may be seen from FIG. 7, when the thermal transmittance is 40 kW/m²·K, Example may be able to handle this condition by setting the flow rate of cooling water to 74.7 L (litter)/min and setting the flow rate of air to 3400 m³/h. On the other hand, when the thermal transmittance is 40 kW/m²·K, Comparative Example 3 may be able to handle this condition by setting the flow rate of cooling water to 95.6 L/min and setting the flow rate of air to 7380 m³/h.

This FIG. 7 indicates that the preferable flow rate of cooling water and the preferable flow rate of air are smaller in Example than in Comparative Example 3 and that the power consumption is smaller in Example than in Comparative Example 3.

As described above, the electronic device rack and the information processing apparatus according to this embodiment may be capable of sufficiently cooling the electronic devices housed in the rack with small power even when the amount of heat generated per rack is over 30 kW. Accordingly, it may be possible to reduce the power consumption of a facility such as a datacenter.

(Modification) In the electronic device rack 10 illustrated in FIG. 1, the amount of air supplied may greatly differ between electronic devices 15 disposed in the upper side of the electronic-device housing unit 11 and electronic devices 15 disposed in the lower side thereof in a case where the speed of air flowing through the second cold aisle 24 from the top to the bottom is high. As a result, the electronic devices 15 disposed in the upper side of the electronic-device housing unit 11 fall into insufficient cooling, which may become a cause of failure and malfunction.

Figure 8:
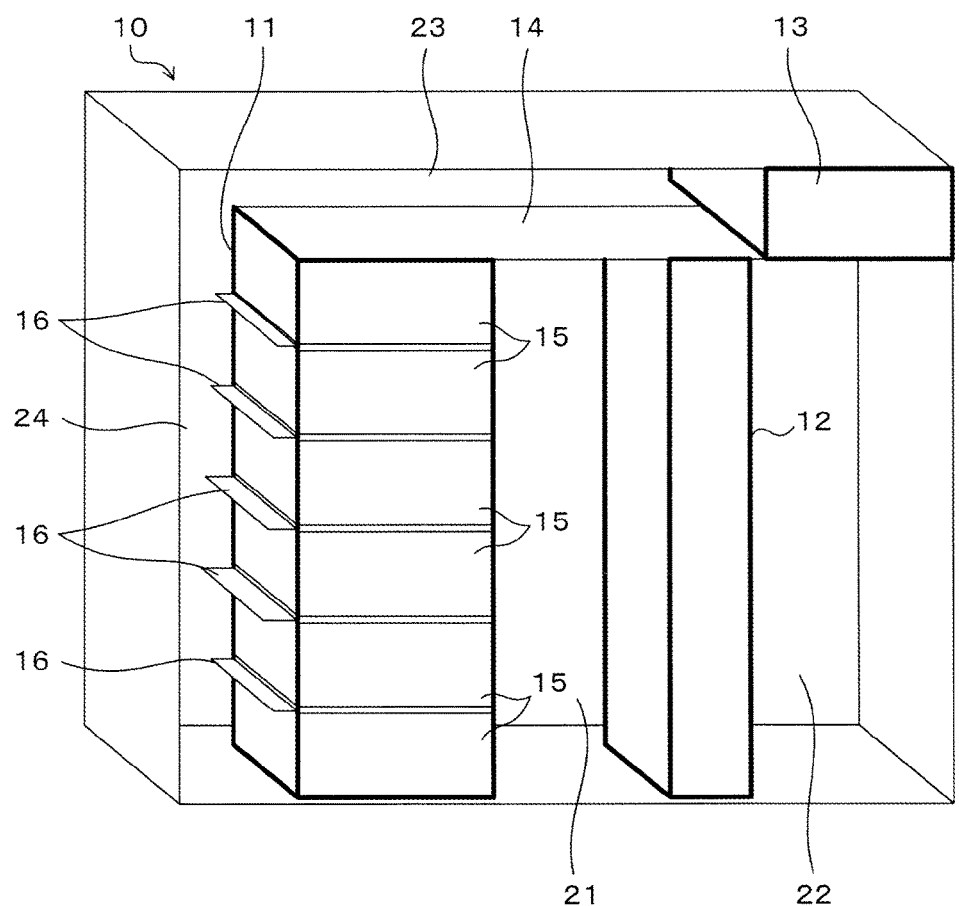
FIG. 8 is a view illustrating a modification of the first embodiment.

In view of this, as illustrated in FIG. 8, a guide plate 16 ejectable and retractable may be provided between each pair of electronic-device housing areas in the electronic-device housing unit 11 so that the amount of air to be supplied to each electronic device 15 may be adjusted based on the amount of projection of its guide plate 16. The amounts of projection of the guide plates 16 may be individually adjusted by the operator, or a temperature sensor may be provided to each electronic device 15 and the amount of projection of its guide plate 16 may be automatically changed according to the temperature detected by that temperature sensor. Note that the guide plate 16 is an example of a flow-rate adjusting unit configured to adjust the flow rate of air passing through an electronic-device housing area.

Second Embodiment

Figure 9:
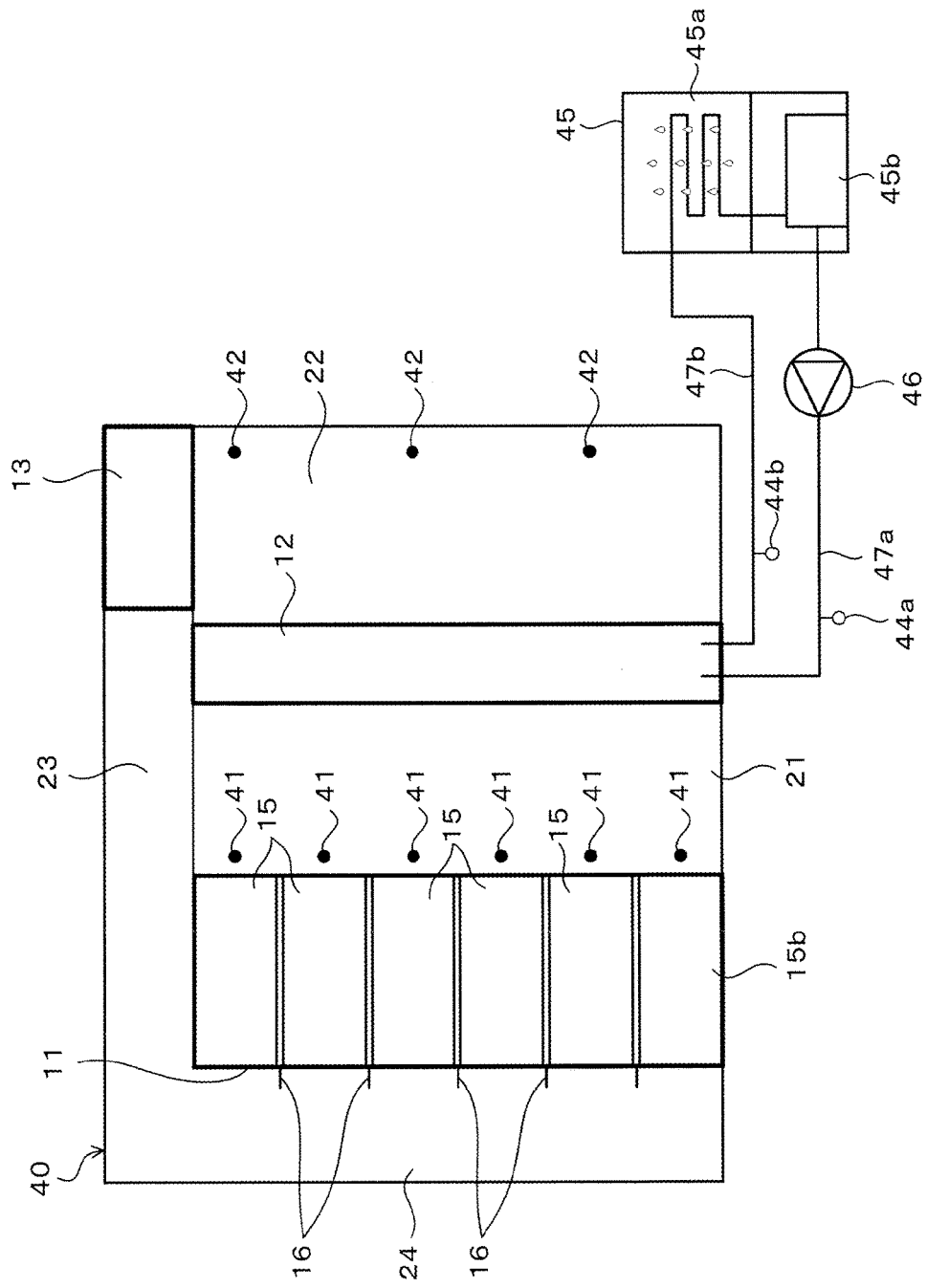
FIG. 9 is a view illustrating an electronic device rack and an information processing apparatus being the electronic device rack and electronic devices housed therein according to a second embodiment.

FIG. 9 is a view illustrating an electronic device rack and an information processing apparatus being the electronic device rack and electronic devices housed therein according to a second embodiment. This embodiment differs from the first embodiment in that the rotational speed of the air blow fan 13 and the amount of cooling water to be supplied to the heat exchanger 12 are controlled according to the difference between the temperatures before and after heat exchange by the heat exchanger 12. The same components in FIG. 9 as those in FIG. 1 will be denoted by the same reference numerals, and description of their overlapping features will be omitted.

As illustrated in FIG. 9, in an electronic device rack 40 of this embodiment, too, a plurality of electronic devices 15 are housed in an electronic-device housing unit 11. In this embodiment, however, a controller 15b is housed at the bottom of the electronic-device housing unit 11. This controller 15b controls the rotational speed of an air blow fan 13 and the amount of cooling water to be supplied to a heat exchanger 12 as will be described later.

Note that the controller 15b may be provided utilizing an electronic device 15 (server) housed in the electronic-device housing unit 11 or provided using an exclusive circuit. In the case where the controller 15b is provided using an exclusive circuit, the controller 15b may be disposed in a location outside the electronic-device housing unit 11.

As illustrated in FIG. 9, in this embodiment, at the air outlet side of each electronic device 15 housed in the electronic-device housing unit 11, there is disposed a temperature sensor 41 configured to detect the temperature of air discharged from the electronic device 15. Moreover, in a first cold aisle 22, there are disposed temperature sensors 42 configured to detect the temperature of air after passing through the heat exchanger 12. Signals outputted from these temperature sensors 41 and 42 are transmitted to the controller 15b.

Moreover, in this embodiment, too, a guide plate 16 is provided between each pair of electronic-device housing areas in the electronic-device housing unit 11 like the modification illustrated in FIG. 8. In this section, it is assumed that the amount of projection of each of the guide plates 16 is changed by driving a driving device (not illustrated) based on the output of a temperature sensor (not illustrated) provided to the corresponding electronic device 15. Note that the temperature sensors 41 illustrated in FIG. 9 may be used as the temperature sensors used to control the guide plates 16. Moreover, the amount of projection of the guide plates 16 may be controlled by the controller 15b.

The heat exchanger 12 is connected to a cooling device 45 through a cooling-water supply pipe 47a and a cooling-water return pipe 47b. A pump 46 is connected to the cooling-water supply pipe 47a, and this pump 46 circulates cooling water between the cooling device 45 and the heat exchanger 12.

A temperature sensor 44a configured to detect the temperature of the cooling water to be supplied to the heat exchanger 12 is disposed in the cooling-water supply pipe 47a. A temperature sensor 44b configured to detect the temperature of the cooling water discharged from the heat exchanger 12 is disposed in the cooling-water return pipe 47b. The outputs of these temperature sensors 44a and 44b are transmitted to the controller 15b as well.

In this embodiment, a hybrid cooling device including a free cooling unit 45a and a refrigerator 45b is used as the cooling device 45. This cooling device 45 normally lowers the temperature of the cooling water with the free cooling unit 45a. However, the refrigerator 45b operates upon a signal from the controller 15b in a case where the free cooling unit 45a does not sufficiently lower the temperature of the cooling water.

Moreover, in this embodiment, an inverter-controlled pump is used as the pump 46. This pump 46 is configured to change the amount of ejection according to a signal from the controller 15b. Note that the flow rate of cooling water to be supplied to the heat exchanger 12 may be changed by using a valve configured to change its opening degree upon a signal from the controller 15b.

The controller 15b controls the rotational speed of the air blow fan 13 and the amount of cooling water to be supplied to the heat exchanger 12 such that the difference between the average temperature of the hot aisle 21 and the average temperature of the first cold aisle 22 will be 20° C. or higher.

The larger the difference between the temperatures before and after heat exchange by the heat exchanger 12 becomes, the larger the heat exchange efficiency of the heat exchanger 12 becomes. In this embodiment, the heat exchange efficiency of the heat exchanger 12 is raised by maintaining the difference between the temperatures before and after heat exchange by the heat exchanger 12 at or above 20° C. as mentioned above, so as to further reduce the power consumption of a facility such as a datacenter.

Figure 10:
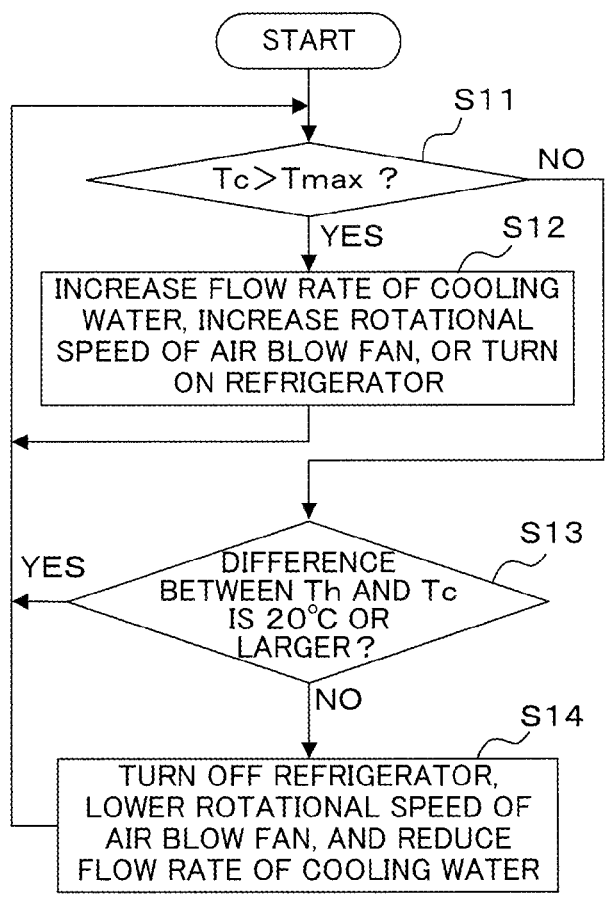
FIG. 10 is a flowchart describing a method of controlling an air blow fan and the amount of cooling water to be supplied by means of a controller in the second embodiment.

Now, a method of controlling the air blow fan and the amount of cooling water to be supplied by means of the controller 15b will be described with reference to a flowchart in FIG. 10.

First, in step S11, the controller 15b calculates an average value Tc of the temperatures detected by the plurality of temperature sensors 42 disposed in the first cold aisle 22, and sets it as the temperature of the first cold aisle 22. The temperature of air to be supplied to each of the electronic devices 15 may be considered to be equal to the temperature Tc of the first cold aisle 22. The controller 15b determines whether or not this temperature Tc is above a predetermined allowable value Tmax.

In a case where the controller 15b determines that the temperature Tc is above the allowable value Tmax (in a case of YES), the cooling of the electronic devices 15 is not sufficient, and there is a possibility of the occurrence of malfunction or failure of the electronic devices 15. In this case, the controller 15b proceeds to step S12, in which the controller 15b lowers the temperature Tc by performing any of operations which are: controlling the pump 46 to increase the amount of cooling water to be supplied to the heat exchanger 12; controlling the air blow fan 13 to increase its rotational speed; and turning on the refrigerator 45b to lower the temperature of the cooling water. Then, the controller 15b returns to step S11 and continues the process.

On the other hand, in a case where the controller 15b determines in step S11 that the temperature Tc is at or below the allowable value Tmax (in a case of NO), the cooling of the electronic devices 15 may be considered to be sufficient. In this case, the controller 15b proceeds to step S13, in which the controller 15b calculates the average value of the temperatures detected by the plurality of temperature sensors 41 disposed in the hot aisle 21 and sets it as temperature Th of the hot aisle 21.

Then, the controller 15b calculates the difference between the temperature Th of the hot aisle 21 and the temperature Tc of the first cold aisle 22. In a case where the controller 15b determines that the difference between the temperature Th and the temperature Tc is or above an allowable value which is 20° C. (in a case of YES), the efficiency of the heat exchange by the heat exchanger 12 is sufficiently high. Thus, the controller 15b returns to step S11 leaving the current state as is, and continues the process.

On the other hand, in a case where the controller 15b determines in step S13 that the difference between the temperature Th and the temperature Tc is below the allowable value which is 20° C. (in a case of NO), the controller 15b proceeds to step S14. Then in step S14, the controller 15b turns off the refrigerator 45b and gradually lowers the rotational speed of the fan 13 to raise the temperature Th of the hot aisle 21. In this case, the load on the electronic devices 15 is reduced and their heat generation is not intense. Hence, the controller 15b further controls the pump 46 to reduce the amount of cooling water to be supplied to the heat exchanger 12 so that excessive cooling may be avoided. Then, the controller 15*b* returns to step S11 and continues the process.

As described above, in this embodiment, the temperatures before and after heat exchange by the heat exchanger 12 are measured with the temperature sensors 41 and 42, and the rotational speed of the air blow fan 13, the amount of cooling water to be supplied to the heat exchanger 12, and the ON-OFF of the refrigerator 45*b* are controlled such that the difference between the temperatures before and after heat exchange by the heat exchanger 12 will be 20° C. or higher. In this way, the heat exchange efficiency of the heat exchanger 12 is raised, and the power consumption of a facility such as a datacenter may be further reduced.

Note that although the temperature sensor 41 is disposed for each single electronic device 15 housed in the electronic-device housing unit 11 in this embodiment, the temperature sensor 41 may be disposed at the air outlet side of one or some of the electronic devices 15 which is or are expected to become the hottest thereamong. Moreover, although three temperature sensors 42 are disposed in the first cold aisle 22, the number of the temperature sensors 42 disposed in the first cold aisle 22 may be 1, 2, 4, or more.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device rack comprising:
   a plurality of panels surrounding a first space which is a part of a space in a room;
   an electronic-device housing unit disposed in the first space and that houses an electronic device;
   a heat exchanger disposed in the first space at a position away from the electronic-device housing unit;
   a second space provided between the electronic-device housing unit and the heat exchanger and isolated from the rest of the first space;
   an air blower that is disposed in the first space and that circulates air inside the first space through the electronic-device housing unit, the second space, and the heat exchanger in the described order;
   a first temperature sensor that is disposed in the first space and that detects a temperature of the air after passing through the electronic-device housing unit and before passing through the heat exchanger;
   a second temperature sensor that is disposed in the first space and that detects a temperature of the air after passing through the heat exchanger; and
   a controller that controls the air blower according to the temperatures detected by the first temperature sensor and the second temperature sensor,
   wherein the controller controls the air blower to maintain a rotational weed of the air blower in a case where a difference between the temperature detected by the first temperature sensor and the temperature detected by the second temperature sensor is equal to or above a predetermined value, and controls the air blower to decrease the rotational speed of the air blower in a case where the difference between the temperature detected by the first temperature sensor and the temperature detected by the second temperature sensor is below the predetermined value.

2. The electronic device rack according to claim 1, wherein the electronic-device housing unit includes a plurality of electronic-device housing areas each configured to house the electronic device, and a flow-rate adjusting unit capable of adjusting flow rates of the air passing through the electronic-device housing area.

3. The electronic device rack according to claim 1, wherein the heat exchanger is a dry-coil heat exchanger.

4. The electronic device rack according to claim 1, wherein the electronic device to be housed in the electronic-device housing unit is a computer.

* * * * *